United States Patent
DiGiacomo et al.

[19]

[11] Patent Number: 5,981,310
[45] Date of Patent: Nov. 9, 1999

[54] MULTI-CHIP HEAT-SINK CAP ASSEMBLY

[75] Inventors: Giulio DiGiacomo, Hopewell Junction; Stephen S. Drofitz, Jr., Wappingers Falls; David L. Edwards, Poughkeepsie, all of N.Y.; Larry D. Gross, Los Gatos, Calif.; Sushumna Iruvanti, Wappingers Falls, N.Y.; Raed A. Sherif, Croton-on Hudson, N.Y.; Subhash L. Shinde, Cortlandt Manor, N.Y.; David J. Womac, Lagrangeville, N.Y.; David B. Goland, Croton-on Hudson, N.Y.; Lester W. Herron, Hopewell Junction, N.Y.

[73] Assignee: International Business Machines Corporation, Armonk, N.Y.

[21] Appl. No.: 09/012,071

[22] Filed: Jan. 22, 1998

[51] Int. Cl.$^6$ .......................... H01L 21/44; H01L 21/48; H01L 21/50
[52] U.S. Cl. ............................................. 438/106; 438/122
[58] Field of Search ...................................... 438/106, 122

[56] References Cited

U.S. PATENT DOCUMENTS

| | | |
|---|---|---|
| 4,034,468 | 7/1977 | Koopman . |
| 4,034,469 | 7/1977 | Koopman et al. . |
| 4,323,914 | 4/1982 | Berndlmaier et al. . |
| 4,607,277 | 8/1986 | Hassan et al. . |
| 4,654,966 | 4/1987 | Kohara et al. . |
| 4,825,284 | 4/1989 | Soga et al. . |
| 4,920,574 | 4/1990 | Yamamoto et al. . |
| 5,081,067 | 1/1992 | Shimizu et al. . |
| 5,126,919 | 6/1992 | Yamamoto et al. . |
| 5,276,586 | 1/1994 | Hatsuda et al. . |
| 5,325,265 | 6/1994 | Turlik et al. . |
| 5,396,403 | 3/1995 | Patel . |
| 5,753,529 | 5/1998 | Chang et al. . |

*Primary Examiner*—Richard Booth
*Assistant Examiner*—Josetta Jones
*Attorney, Agent, or Firm*—Ratner & Prestia; Joseph P. Abate

[57] ABSTRACT

A multi-chip module and heat-sink cap assembly and method of fabrication, which provides sufficient cooling for higher power density chips. The heat-sink cap has heat-sink columns disposed over each chip on a substrate. The heat-sink columns are interconnected by flexible members to provide a unitary cover. Thin film metallization of at least a portion of the mating surfaces of the substrate, chips and heat-sink column permits soldering of the cap to the chips and substrate to form the package which is a mechanically stable structure with no degradation of interconnection fatigue life due to thermal cycling of the assembly when in use.

11 Claims, 3 Drawing Sheets

MULTI-CHIP HEAT-SINK CAP ASSEMBLY

TECHNICAL FIELD

The present invention relates to packaging of electronic circuit devices, such as micro-miniature integrated circuit chips. In particular, the present invention relates to a combined heat-sink and cap assembly for improved dissipation of heat generated by the chips.

BACKGROUND OF THE INVENTION

Heat dissipation from multi-chip high power modules without adversely affecting the mechanical stability and fatigue life of the solder joints is a problem for the industry.

Current modular designs do not effectively dissipate heat beyond power densities on the order of 25 watts/cm$^2$ without resorting to expensive methods such as use of water or liquid coolant, which minimizes the external thermal resistance and consequently permits a worse internal thermal resistance. The power dissipation limit results from both the internal and external thermal resistance to heat flow.

For air cooled flip chip modules the majority of the thermal resistance is the external resistance. The internal resistance is dominated by the resistance of the chip to cap interface, which is typically filled with a thermal paste. One way to significantly reduce this interface resistance is to replace the paste with solder, but this replaces a compliant interface with a rigid interface, which can cause stresses that adversely affect other parts of the package.

In order to achieve higher power dissipation without compromising fatigue life of solder connections it must be possible to solder the chips to the cap with different gaps between them. It is known that there can be gaps that vary by plus or minus 3 mils between the cap and the chips. The assembly must balance the thermal expansion in the x, y and z directions for the substrate, cap and the chip/solder structure so that the shear and tensile stresses in the solder thermal interface, solder seal, and solder interconnections are kept within acceptable limits.

There are instances of heat sinks directly attached to a single chip and not connected to the substrate because of stresses and fatigue problems, however, this approach is not conducive to, and effective for MCM's that must be encapsulated to avoid corrosion and excessive fatigue damage of solder interconnections due to high concentrations of oxygen. The best thermal performance today is the dissipation of about 50 watts/cm$^2$, (at the chip level), using air-cooled heat-sinks.

U.S. Pat. Nos. 4,034,468 4,323,914, 4,607,277, 4,654, 966, 4,825,284, 4,920,574, 5,126,919 5,276,586, 5,325,265 and 5,396,403 disclose various types of packages for semiconductor devices with the provision of heat transfer from the chip to the ambient environment.

SUMMARY OF THE INVENTION

A multi-chip heat sink cap assembly is effected using a compliant heat-sink cap structure. The heat-sink cap structure is fabricated so that the heat-sink columns to be arrayed over the chips on the substrate are interconnected via flexible members achieving a unitary structure to overlay the substrate. A portion of the surface of the chip and a portion of the surface of the heat sink column that are to be juxtaposed to one another are coated with a metallized thin film. Solder preforms are placed between the mating metallized surfaces and between the peripheral edge of the heat-sink cap and the substrate. The entire assembly is subject to a solder reflow process to achieve the device of the present invention.

Utilizing a process wherein the assembly is manufactured by manufacturing a compliant heat-sink cap, metallizing the mating surfaces of the chip and the heat sink column and reflowing solder results in the dramatic improvement in the cooling capacity of single and multi-chip modules without impacting the reliability of the chip to substrate interconnects and without the need for an exotic liquid cooling system, such as found in prior art mainframe computers. The apparatus and method according to the present invention overcome the difficulty of reliably attaching a cap/heat-sink to a substrate and chips while insuring that all chip sites are reliably interconnected in a multi-chip module. Thus, heat dissipation by improving the thermal conductive capacity of the modules is accomplished so that higher power chips can be used. Heat dissipation at a much greater rate than is possible with prior art devices can be effected with the method and apparatus of the present invention. This can be on the order of 75 watts/cm$^2$ or greater, (chip power density).

Thus in one aspect the present invention is a method for fabricating a multi-chip module with an integral heat-sink cap combination by, providing a substrate with a plurality of chips fixed to and arrayed in a specific pattern, forming a heat-sink cap comprising a plurality of heat-sink columns, each heat-sink column having a surface adapted to be bonded to an individual chip, the heat-sink column interconnected by flexible members, the heat-sink columns arrayed in an identical pattern to the chips on the substrate, depositing a conductive thin film on at least a portion of the surfaces of the chips and the heat-sink columns that are to be bonded together, assembling the substrate and the heat-sink cap with solder between mating portions of the heat-sink cap and the chips and between the heat-sink cap and the substrate, and reflowing the solder to effect bonding of the heat-sink to the substrate and the chips.

In another aspect the present invention is a multi-chip module with integral heat-sink cap manufactured by providing a substrate with a plurality of chips fixed to and arrayed in a specific pattern, forming a heat-sink cap comprising a plurality of heat-sink columns, each heat-sink column having a surface adapted to be bonded to an individual chip, the heat-sink columns interconnected by flexible members, the heat-sink columns arrayed in an identical pattern to the chips on the substrate, depositing a conductive thin film on at least a portion of the surfaces of the chips and the heat-sink columns that are to be bonded together, assembling the substrate and the heat-sink cap with solder between mating portions of the heat-sink cap and the chips and between the heat-sink cap and the substrate, and reflowing the solder to effect bonding of the heat-sink to the substrate and the chips.

DETAILED DESCRIPTION OF THE INVENTION

According to the structure and method of the invention the internal thermal interface resistance to heat flow in a chip heat-sink assembly is reduced by a factor of approximately 10, therefore, greatly enhancing power dissipation capacity. The enhancement of heat dissipation is effected by using solder as an interconnect medium between the chip and the cap where the surfaces of the chip and the cap have been covered with a thin metal film so that a metallic bond is formed and thermal resistance is minimized without causing mechanical instabilities and stresses which are detrimental to the fatigue life of such joints and to the fatigue life of the chip to substrate interconnections.

Figure 1:
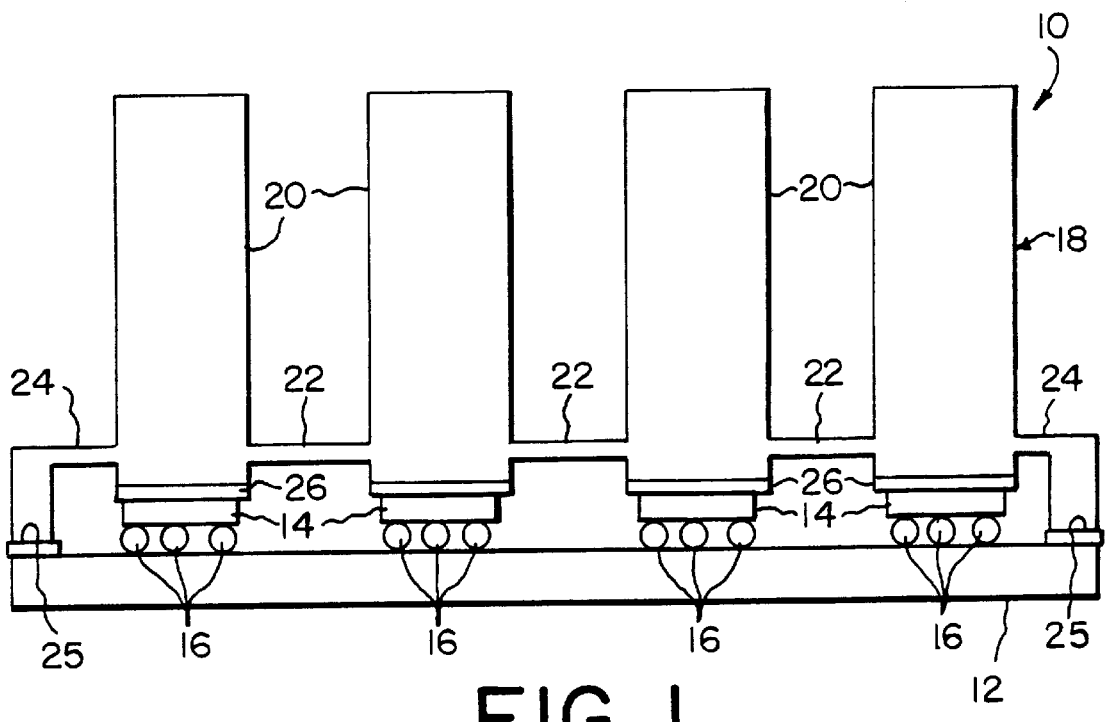
FIG. 1, is a schematic elevational view of an assembly according to the present invention.

Referring to FIG. 1 numeral 10 represents a multi-chip package wherein a substrate 12 contains a plurality of chips 14 which are bonded to the substrate using a controlled collapse chip connection referred to as C-4 or solder bump technology. The chip to substrate connections are identified by the numerals 16. In the device of FIG. 1 the substrate 12 can be manufactured from well known materials such as alumina, aluminum nitride, glass ceramic, mullite, silicon carbide and beryllium oxide. Overlaying the substrate 12 and the chips 14 is a heat-sink cap 18 comprising a plurality of heat-sink columns 20 interconnected by thin members 22 and a peripheral thin member and connector 24. The heat-sink cap 18 can be manufactured from aluminum nitride, an aluminum-silicon carbide alloy, silicon carbide, or copper-tungsten. The material for the heat-sink-cap 18 is selected to exhibit a coefficient of thermal expansion similar to that of the substrate 12. The surfaces of the chips 14 juxtaposed to the heat sink columns 20 are typically covered with a chromium/nickel/gold thin film layer. A like chromium/nickel/gold thin film layer is placed on the surface of the heat sink column 20 that is juxtaposed to the chip 14 and to the surface 25 of the edge portion 24 of the heat sink cap 18 that will be bonded to the substrate 12 and on the edge portion of substrate 12 that will be bonded to heat-sink cap 18.

Figure 2:
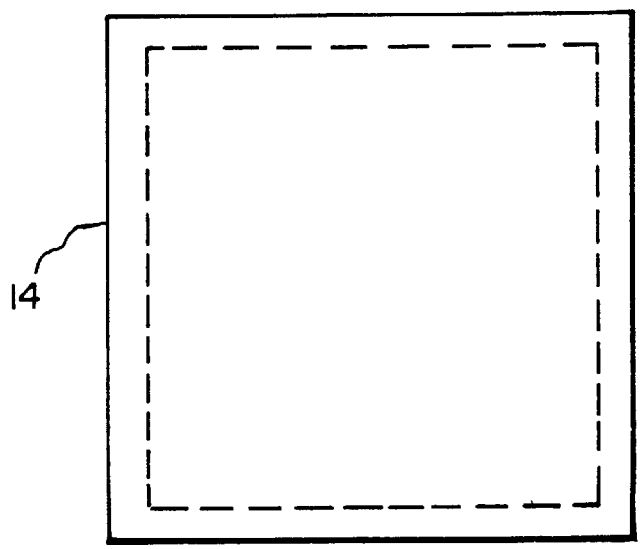
FIG. 2, is a top plan view of a chip indicating placement of the thin film structure.

As shown in FIG. 2, the area of the chip 14 that is covered with the chromium/nickel/gold thin film is that area shown within the dotted lines of the surface of chip 14 that is juxtaposed to the heat-sink column 20.

Figure 3:
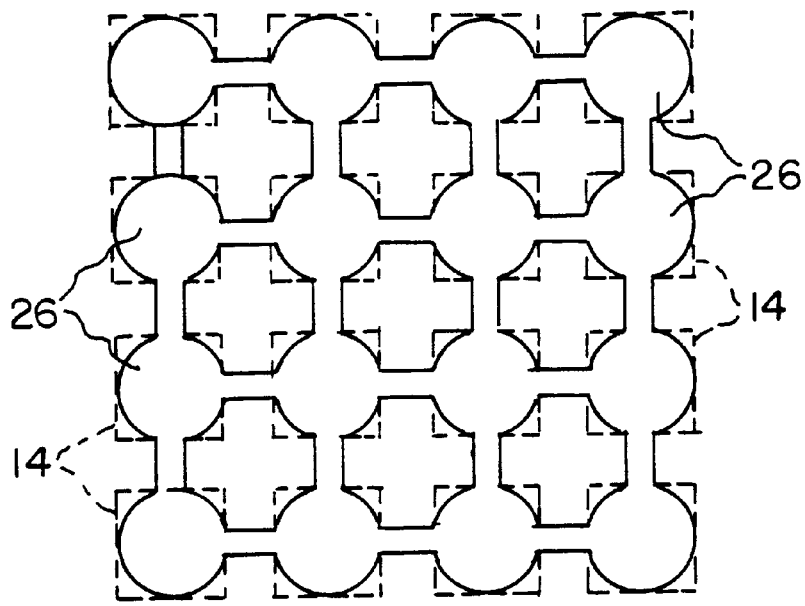
FIG. 3, is the top plan view of solder performs applied to chip sites and cap sites according to the present invention.
Figure 4:
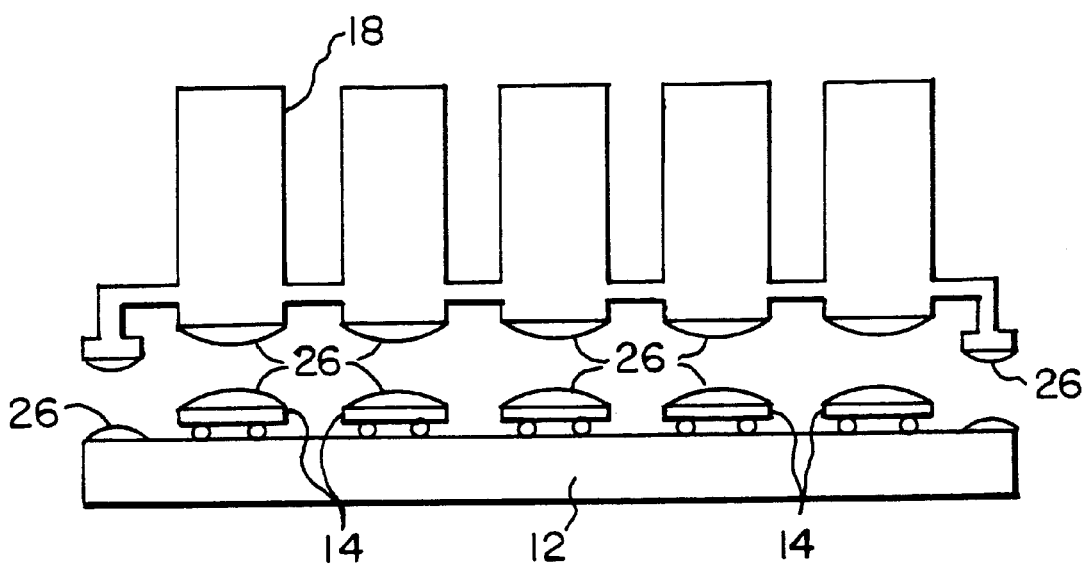
FIG. 4, is a front elevational schematic showing the solder performs in place prior to reflow for an apparatus according to the invention.

As shown in FIG. 3, solder preforms 26 are placed or formed on the metallized surfaces of the chips 14 and the metallized surfaces of the heat-sink columns 20. It is well-known in the art that solder preforms can be formed in place or manufactured separately and then positioned for solder reflow to join microelectronic devices. The preforms can be reflowed onto the chips 14 and the heat-sink columns 20 before assembly as shown in FIG. 4 where the heat-sink cap and the substrate containing the chips are shown positioned for final assembly. The high-lead and eutectic Pb—Sn solders (and other Sn- and In-bearing solders) have a thermal conductivity about an order of magnitude higher than the best thermal paste developed, which is the medium often employed for thermal connection between chips and lid in multi-chip modules (MCM) and single chip modules (SCM). In an alternate embodiment, the preform over each chip is square, or x-shaped. In another embodiment, a single large preform without cutouts covers all the solder wettable areas. In another embodiment preforms over the chips have different sizes to accommodate chips of different sizes. In another embodiment individual preforms are used at each wettable area.

Figure 5:
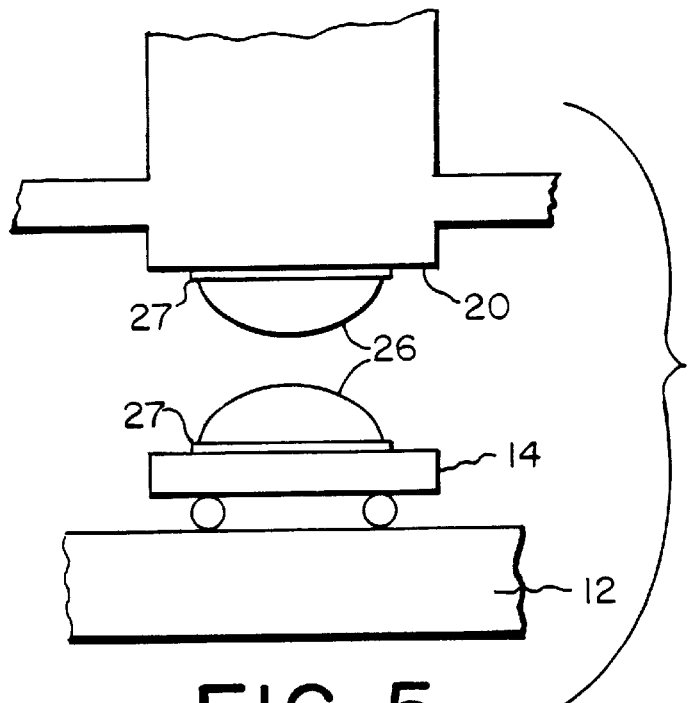
FIG. 5, is an enlarged fragmentary schematic showing the placement of the solder preforms prior to final assembly.

As shown in FIG. 5, the thin film of chromium nickel and gold 27 is placed on the chip 14 and the heat-sink column 20 in such a manner that there is a portion of the non-metallized surface of the chip 14 and a portion of the non-metallized surface of the heat-sink column 20 to which solder may flow to accommodate for a variability in the gap between the chip and heat-sink column as hereinafter will be more fully explained. The solder preform 26 is placed on the thin film of chromium nickel and gold 27. The thin film of chromium/nickel/gold 27 can be deposited by any of the well known techniques that would result in deposition of 0.1 $\mu$m chromium, 2 $\mu$m nickel and 0.5 $\mu$m gold.

Special attention is paid to the contact areas between the chip and cap and between the cap and the substrate. The thin film structure of 0.100 $\mu$m chromium, 2.00 $\mu$m nickel and 0.50 $\mu$m gold can have film thicknesses that vary within plus or minus 50%. The film is evaporated or deposited on the surface of the chip 14 and the surfaces of the cap 18 where the chip and cap or substrate and cap are to meet and be bonded together. In addition, the peripheral edge of the substrate that is to be bonded to the peripheral edge of the cap is also provided with the thin film. The thin films provide a reactive surface for the molten solder during reflow so that a metallic or intermetallic bond is formed. Solder is used to fill the gap between the chip 14 and cap 18 because it is thermally effective in connecting the heat-sink cap to the chip regardless of differing gaps, characteristic of multi-chip modules; solder has a thermal conductivity an order of magnitude higher than thermal pastes and greases presently used in industry and can therefore accommodate variations in cap-chip gap with minimal thermal impact. Solder is used to fill the gap between cap and substrate to achieve a hermetic seal.

Figure 6:
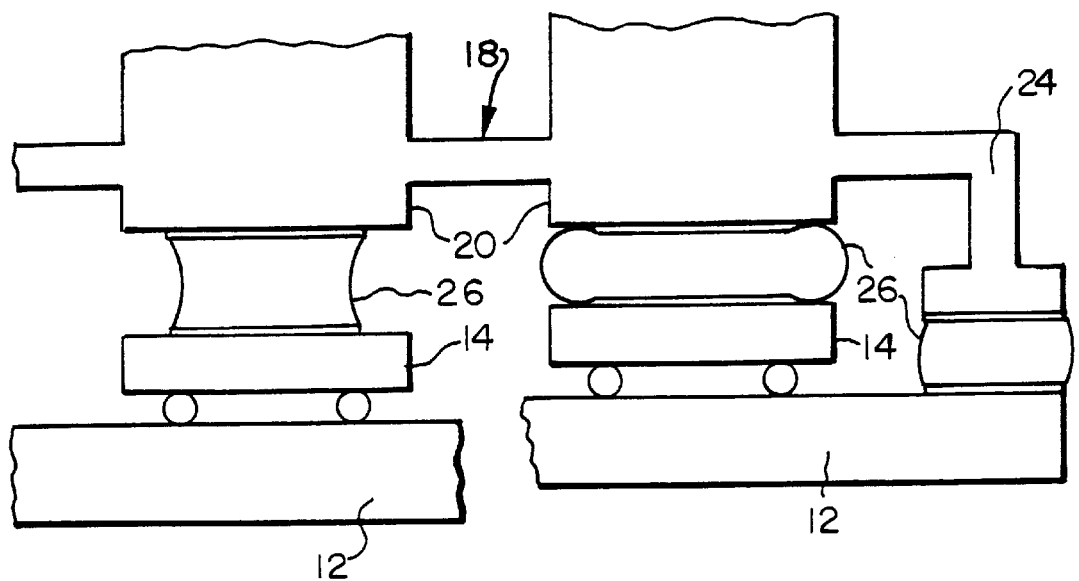
FIG. 6, is a partial fragmentary view illustrating accommodation of varying gaps between the heat-sink cap and chip filled with a fixed volume of solder.

Referring to FIG. 6, the schematic illustration shows the heat-sink cap 20 sealed to the substrate 12 at the peripheral edge by reflowing the solder preform 26. The chips 14 are connected to the heat-sink cap 20 at the heat-sink column 20 locations using the solder preforms 26. As shown in FIG. 6 the chip 14 on the left side was spaced at a greater vertical distance from the cap 18 then was the chip 14 on the right side thus, showing two different cross sectional configurations for the reflowed solder. In either case the construction of the cap according to the present invention and the use of the thin film accommodates the mismatch in spacing and permits solder bonding without loss of strength or thermal connectivity between the chip and the heat-sink cap 18.

The cap placed over the chips is aligned and heated in a furnace above the melting point of the solder to cause solder reflow and to have an adequate reaction rate with the films and join the chips and substrate to the cap.

A typical solder thickness, between chip and cap and peripheral seal is 15 mils plus or minus 4 mils. The simultaneous reflow of the solder in chip sites and the seal band saves time and reduces costs. The same can be said for designing the heat-sink and cap as a single unit without additional interfaces, i.e., heat-sink to cap, which cuts manufacturing cost and further reduces the total thermal resistance.

The thin-film structure consists of 0.100 $\mu$m Cr, 2.00 $\mu$m Ni, and 0.50 $\mu$m Au, and must cover an area 80 to 90% that of the chip on both sides (chip and cap sides), leaving a bare band around the chip perimeter, having a width equivalent to 10 to 5% of the distance from the center as illustrated in FIG. 2.

The structure according to the invention provides a unique way to avoid excessive stress that would lead to mechanical failure and fatigue damage of the C-4 connection of the chips to the substrate. The narrow or thin interconnections 22 between the heat sink columns and the chip sites allow for bending caused by different thermal expansion of the materials of the assembly. The cap and heat sink 18 is connected to the chip via lead/tin solder alloys but is not restricted to such solder systems. Any of the well known soldering techniques can be employed in the method of the present invention.

Bonding of the solder is achieved through the chromium/nickel/gold thin film structure which reacts with the solder during reflow. However, other solder/wettable film techniques could be used. Here again the heat-sink is configured to efficiently transfer the heat from the chip to the air.

According to the present invention the method extends the heat dissipation rate of the apparatus to chip power densities of 75 watts/cm$^2$ and higher. It is also possible with the present invention to provide further thermal enhancement or thermal management improving the heat-sink design.

The present invention reduces the internal thermal interface resistance by about a factor of 10 for a solder thickness equal to that of the thermal paste. Even when the solder thickness is made twice as thick as the paste, the thermal interface resistance is still a factor of 5 lower than that of the paste. Several requirements are satisfied by the invention in order to have a mechanically stable structure and adequate thermal conduction for the new generation of high power modules:

1. Total expansion in the Z-direction of C-4/chip/solder structure is comparable to the cap/seal-band and cap material for the same thermal path length.
2. Cap and substrate are made of the same material or materials with comparable thermal coefficients of expansion (TCE), i.e., aluminum nitride/aluminum nitride, aluminum nitride/glass ceramic, to avoid excessive shear stress and strain in the C-4 joint and therefore unacceptable fatigue performance.
3. The outer portion of the chip surface and corresponding peripheral areas at chip sites of the cap will typically not have the thin-film structure coverage so that the solder is free to expand over the surface when the amount is excessive for the particular cap-to-chip gap, thus preventing the solder from falling off the chip edge. When the gap is larger than average, the solder will retract somewhat, showing a concave meniscus. This feature accommodates the gap variation for a fixed solder preform volume. In an alternate embodiment, the entire backside of the chip is metalized. The preforms are reflowed in-situ together with the seal band preforms which are applied to the substrate and cap. In an alternate embodiment, the preforms are prejoined to only the chips or the cap. In yet another embodiment the preforms are not joined to either the chip or cap prior to final assembly. The method of the invention accommodates different gaps between chips and the heat-sink cap and the meniscuses that develop in the solder, which will vary within plus or minus 30%.
4. The cap thickness can vary from 1 to 2.5 mm so that it can absorb any vertical (Z-direction) displacement of the chip with minor stress on the C-4 in cases when cap and substrate TCE's are somewhat different. Cap flexibility extends the application of this invention to cases when substrate and cap are notably dissimilar such that thermal displacement balance between chip/solder structure and cap material/solder-seal cannot be achieved.

The expansion in the Z-direction causes no stress in the C-4 when the cap and substrate are made of aluminum nitride (AlN). For a solder thickness between chip and cap of 15 mils, C-4 height of 3 mils, and chip thickness of 30 mils, the vertical displacement of the cap from the chip is 0.00044 mils the same as the displacement occurring in the AlN cap joined to the substrate with a 15-mil thick solder, using TCE's of $4.6 \times 10^{-6}/°$ C. for AlN, $2.6 \times 10^{-6}/°$ C. for Si, and $20 \times 10^{-6}/°$ C. for the solder. The Z-direction, therefore, can be made stress-free by selecting the proper materials among the ones in common use in the industry with matching thicknesses among the ones in common use in the industry with matching thicknesses that produce the stress-free state. What if the materials cannot achieve a stress-free state? For instance in the case of a cap made of aluminum (Al) or copper (Cu), the vertical displacement for the above example will be of the order of 1.5 and 1 micrometers respectively for a temperature excursion of 100 C, corresponding to a C-4 stain of about 2 and 1.3% if the cap were infinitely rigid. But for a cap thickness of 1 or 2 mm, the solder expands or contracts against the flexible cap which induces stresses well within the elastic limit, such that the strain has no fatigue effect on the C-4 under field application conditions. This is true for multi-chip modules and single chip modules, the latter exerting the highest stress on the C-4, given the smaller substrate size and the same cap thickness compared to a multi-chip module, and the fact that one chip supports the load in an SCM.

As for the shear stress and strain (which depend linearly on the solder joint distance from the center of the chip and thus from the center of the substrate assuming C-4 and chip array symmetry), caused by the thermal expansion of the cap and chip relative to the substrate, the requirement is that the TCE's of cap and substrate in the multi-chip module be comparable in order to achieve a minimum shear strain in the interconnection, however materials having different TCE's such as AlN cap ($4.6 \times 10^{-6}/°$ C.) and alumina substrate ($6.2 \times 10^{-6}/°$ C.) can be used not only with single-chip modules but also with multi-chip modules since solder seal constraint provides ample relief for the shear strains. For plastic substrates, on the other hand, the cap can be made of aluminum, which has a TCE of $25 \times 10^{-6}/°$ C., comparable to that of the plastic. But in conjunction with plastic substrates one can also use AlN, alumina, and glass ceramic since the plastic substrate will be easily constrained by such strong materials, given that they have elastic moduli about 50 times larger than that of the plastic. And since the plastic will be in tension in the X-Y plane as it cools down from the sealing temperature, any subsequent thermal cycle in the field is an exercise between tension and less tension, following the substrate dimensions and contributing very little to fatigue as there is no relative displacement between cap an substrate and therefore no buckling or warping, which constitutes an advantage since warping generates tensile strain in the Z-direction of the C-4. Therefore, there is no real limitation due to stresses in the choice of a cap to match a substrate except in extreme cases of materials that are extraneous and uncommon to the industry.

The lateral expansion of the solder must be allowed, as explained, to accommodate the different gap heights (in a multi-chip module) between chip and cap, given a constant solder volume fixed by the preform thickness. The gap can vary by plus or minus 30%. For a 15 mm chip the lateral movement of the molten solder to and from the edge of the chip during capping will be roughly plus and minus 1 mm. This is a reasonable variation that presents no physical problem and no thermal shortcomings since the solder conductivity is an order of magnitude larger than that of the best thermal paste available, and fluctuations of the order 30% are therefore not significant. Thus, the thin films on the chip will be applied up to 1 mm from the edge, allowing the solder to expand up to 1.5 mm due to the convex meniscus which also has no physical interfaces.

In summary, the novel combination of materials and cap structure is used to create a semiconductor package for multi-chip modules as well as single-chip modules that offers a dramatic improvement in heat removal from the chips to ambient air. The use of solder preforms at both the chip-to-cap gap and cap-substrate seal together with a flexible cap and accommodating gap variations (with minimal stress), are essential and key to this invention.

The invention extends the chip power density applications to 75 watts/cm$^2$ and greater without sacrificing interconnection fatigue life or other reliability factors.

The present invention reduces costs because of the single-piece design combining heat-sink and cap and because the joining process is reduced to a single operation, involving sealing the module at the seal band and connecting the chips to the cap.

By practically eliminating the internal thermal interface resistance, the present invention provides the opportunity to make great advances in heat dissipation and thermal management as the total resistance is dominated by the external resistance.

Although illustrated and described herein with reference to certain specific embodiments, the present invention is nevertheless not intended to be limited to the details shown. Further, various modifications may be made in the details within the scope of the invention as defined in the following claims.

What is claimed:

1. A method for fabricating a multi-chip module with integral heat sink cap comprising the steps of:

providing a substrate with a plurality of chips fixed to and arrayed in a specific pattern thereon;

forming a heat-sink cap from a material having a coefficient of thermal expansion similar to that of the substrate comprising a plurality of heat-sink columns, each heat-sink column having a surface adapted to be bonded to an individual chip, the heat-sink columns interconnected by flexible members, the heat-sink columns arrayed in an identical pattern to the chips on the substrate;

depositing a conductive thin film on at least a portion of the surfaces of the chips and the heat-sink columns that are to be bonded together;

assembling the substrate and the heat-sink cap with solder between mating portions of the heat-sink cap and the chips and between the heat-sink cap and the substrate; and reflowing the solder to effect bonding of the heat sink cap to said substrate and said chips.

2. A method according to claim 1 including fabricating the heat-sink cap with the flexible connections between the heat-sink columns formed as a unitary structure.

3. A method according to claim 1 including fabricating the heat-sink cap from a material selected from the group consisting of aluminum nitride, aluminum-silicon carbide alloy, silicon carbide, copper-tungsten, aluminum and copper.

4. A method according to claim 1 including mounting the chips on a substrate selected from the group consisting of alumina, aluminum nitride, glass ceramic, mullite, silicon carbide and beryllium oxide.

5. A method according to claim 1 wherein the thin film is deposited using chromium, nickel and gold as source materials.

6. A method according to claim 1 wherein the mating surfaces of the chips and said heat-sink columns are coated with the conductive thin film leaving a continuous margin (band) around the periphery of the chips and the heat-sink column, the margin being 5 to 10% of half the width of the chips.

7. A method for fabricating a multi-chip module with integral heat sink cap comprising the steps of:

providing a substrate with a plurality of chips fixed to and arrayed in a specific pattern thereon;

forming a heat-sink cap from a material having a coefficient of thermal expansion similar to that of the substrate comprising a plurality of heat-sink columns, each heat-sink column having a surface adapted to be bonded to an individual chip, the heat-sink columns interconnected by flexible members, the heat-sink columns arrayed in an identical pattern to the chips on the substrate;

depositing a conductive thin film on at least a portion of the surfaces of the chips and the heat-sink columns that are to be bonded together with the conductive thin film leaving a continuous margin (band) around the periphery of the chips and the heat-sink column, the margin being 5 to 10% of half the width of the chips;

assembling the substrate and the heat-sink cap with solder between mating portions of the heat-sink cap and the chips and between the heat-sink cap and the substrate; and reflowing the solder to effect bonding of the heat sink cap to said substrate and said chips.

8. A method according to claim 7 including fabricating the heat-sink cap with the flexible connections between the heat-sink columns formed as a unitary structure.

9. A method according to claim 7 including fabricating the heat-sink cap from a material selected from the group consisting of aluminum nitride, aluminum-silicon carbide alloy, silicon carbide, copper-tungsten, aluminum and copper.

10. A method according to claim 7 including mounting the chips on a substrate selected from the group consisting of alumina, aluminum nitride, glass ceramic, mullite, silicon carbide and beryllium oxide.

11. A method according to claim 7 wherein the thin film is deposited using chromium, nickel and gold as source materials.

* * * * *